United States Patent [19]
Gulczynski

[11] Patent Number: 4,940,906
[45] Date of Patent: Jul. 10, 1990

[54] POWER SWITCH DRIVER

[76] Inventor: Zdzislaw Gulczynski, P.O. Box 441, Winchester, Mass. 01890

[21] Appl. No.: 229,914

[22] Filed: Aug. 8, 1988

[51] Int. Cl.[5] .......................... H03K 3/01; H03K 3/26
[52] U.S. Cl. ................................ 307/296.1; 307/475; 307/270; 307/570
[58] Field of Search .................. 307/270, 296.1, 296.4, 307/296.3, 578, 571, 239, 443, 475, 570, 572, 577; 323/312, 351; 333/181

[56] References Cited

U.S. PATENT DOCUMENTS

| | | | |
|---|---|---|---|
| 3,968,385 | 7/1976 | Van Tol | 307/270 |
| 4,268,762 | 5/1981 | Ienaka et al. | 307/296.1 |
| 4,360,744 | 11/1982 | Taylor | 307/270 |
| 4,540,893 | 9/1985 | Bloomer | 307/270 |
| 4,555,644 | 11/1985 | Devecchi et al. | 307/578 |

OTHER PUBLICATIONS

"IBM Technical Disclosure", vol. 26, No. 78, Dec. 1983, "Driver Block Skew Minimizer," by Culican.

"Transient Push-Pull Driver", IBM Technical Disclosure Bulletin, vol. 18, No. 11, Apr. 1976, by Klara et al.
"Mosfet Powering Circuit", IBM Technical Disclosure Bulletin, vol. 13, No. 9, Feb. 1971, by Sonoda.

*Primary Examiner*—Stanley D. Miller
*Assistant Examiner*—Richard Roseen

[57] ABSTRACT

The driver is a controlled four-terminal device having an extremely high switching speed, small input current and large output current capability. The driver can control switching power devices such as MOSFETs, thyristors and triacs, requiring floating drive circuit and large input current pulses. The driver is intended to operate in systems requiring a constant or occasional switching, e.g. switching power supplies and switching power amplifiers. One driver comprises a source providing a current in response to input signal, a resistor obtaining a voltage in response to the current, a capacitor storing a supply voltage, a rectifier coupled between the capacitor and resistor for limiting the voltage thereacross, and a buffer receiving the supply voltage and providing binary output signal in response to the voltage across the resistor.

19 Claims, 3 Drawing Sheets

POWER SWITCH DRIVER

CROSS REFERENCE TO RELATED INVENTIONS

This application is related to: "Capacitive Load Driver with Binary Output" Ser. No. 474,488 filed 02/02/90; "Ultra Fast Logic with Temperature Compensation and Minimized Supply Voltage" Ser. No. 474,489 filed 02/02/90; "3-Terminal Bidirectional Switching Power Supply with AC or DC Input and AC or DC Output" Ser. No. 444,729 filed 12/01/89; "Switching Power Supply with Constant or Sinusoidal Input Current and with Fixed or Variable Output Voltage" Ser. No. 444,730 filed 12/01/89; "Switching Power Supply with Constant or Sinusoidal Input Current" Ser. No. 393,391 filed 08/14/89; "Switching Power Supply Comprising Pair of Converters for Obtaining Constant or Sinusoidal Input Current and Fixed or Variable Output Voltage" Ser. No. 393,392 filed 08/14/89; "Ultra Efficient Switching Power Amplifier" Ser. No. 363,213 filed 06/08/89; "Synchronous Switching Power Supply with Boost and/or Flyback Converters" Ser. No. 363,327 filed 06/08/89; "High Power Switching Factor Correction Circuit" Ser. No. 338,328 filed 04/17/89; "High Power Switching Power Supply with High Power Factor" Ser. No. 304,508 filed 01/31/89; "High Power Switching Power Supply with High Power Factor" Ser. No. 304,509 filed 01/31/89; "Synchronous Switching Power Supply with Flyback Converter" U.S. Pat. No. 4,853,837 dated 08/01/89; "Analog Power Amplifier" U.S. Pat. No. 4,866,398 dated 09/12/89; "High Efficiency Power Amplifier Comprising Multilevel Power Supply" U.S. Pat. No. 4,871,980 dated 10/03/89; "Switching Power Amplifier" U.S. Pat. No. 4,763,080 dated 08/09/88; "Switching Circuits Performing Thyristor and Triac Functions" U.S. Pat. No. 4,845,391 dated 07/04/89; ¢Switching Power Supply" U.S. Pat. No. 4,803,610 dated 02/07/89; "Power Amplifier" U.S. Pat. No. 4,782,306 dated 11/01/88; "Switching Power Supply" U.S. Pat. No. 4,736,286 dated 04/05/88; and "Push-Pull Power Amplifiers" U.S. Pat. No. 4,476,441 dated 10/09/84. All inventions are by the same inventor.

BACKGROUND OF THE INVENTION

The invention generally relates to four-terminal driver for switching power devices such as MOSFETs, thyristors and triacs, requiring floating drive circuit and large input current pulses. The driver is characterized by an extremely high switching speed and is intended to operate in systems requiring a constant or occasional switching, e.g. switching power supplies and switching power amplifiers.

Switching power devices are controlled by a relatively small voltage applied across a pair of terminals. However, the input current may be substantial. Some power devices require continuous large input current, e.g. single bipolar transistors. Other devices demand merely large initial current. For instance, thyristor (silicon controlled rectifier or SCR) and triac can be triggered by a low-level voltage applied between a cathode and gate. A pulse of the input current is injected thereinto as these devices are automatically turned off by reducing an anode voltage or reducing principal current below a hold current.

The gate impedance of a power MOSFET is a high resistance shunted by a large composite gate capacitance, including Miller effect capacitance. Therefore, the MOSFET requires fairly large input current to change the gate voltage. Due to a limited transconductance, the switching speed of the MOSFET depends upon the rate at which gate charge is supplied or removed. Consequently, the MOSFET driver should minimize any lead inductance by reducing loop areas. For instance, each inch of wire adds about 20 nanohenries of inductance.

The conventional drivers comprise complex current pulse drive circuits. The employment of transformers having a small turns ratio results in large currents which must be delivered to the primary winding. Moreover, numerous problems are introduced. For instance, transformers are bulky and expensive. Their high frequency performance is very poor. Snubber and clamp circuits are necessary to prevent forward and reverse voltage spikes, and reduce RFI. In another method an optocoupler is employed for controlling the driver. A supply voltage is applied thereto by a auxiliary power supply including an isolation transformer. This method results in a higher performance. However, parasitic capacitances introduced by the auxiliary power supply must be very small and the parts count and size are increased.

SUMMARY OF THE INVENTION

The present invention is intended to provide controlled four-terminal power switch drivers having an extremely high switching speed, small input current, large output current capability, small size and cost. The drivers have floating ground, wherein maximum operating voltage is limited only by break down voltage of one to three transistors coupled as current sources. Other devices operate at low voltage. No inductive components are necessary. The drivers can be carried out in integrated form as four-terminal devices. Additional terminals may be provided for external capacitors.

A driver according to the present invention converts input signal into binary output signal and comprises a source means for providing a current in response to the input signal, a resistive means for obtaining a voltage in response to the current, a capacitive means for storing a supply voltage, a rectifying means coupled between the capacitive means and resistive means for limiting the voltage thereof, and a buffer means for receiving the supply voltage and providing the binary output signal in response to the resistive means voltage.

In another embodiment the driver comprises an isolating means having an input and output for receiving the input signal and providing a signal in response thereto respectively, wherein an impedance between the input and output is substantially high, a source means for providing a current, a capacitive means for receiving the current and storing a supply voltage, and including a means for limiting the supply voltage, and a buffer means for receiving the supply voltage and providing the binary output signal in response to the isolating means signal.

In yet another embodiment the capacitive means includes an input capacitive means for storing a first voltage, a means for converting the first voltage into a second voltage of an opposite polarity, and an output capacitive means for storing the second voltage, wherein the supply voltage is provided by the input and/or output capacitive means.

BRIEF DESCRIPTION OF THE DRAWINGS

The present invention will become more clear in conjunction with the accompanying figures of which.

DETAILED DESCRIPTION OF THE INVENTION

Figure 1:
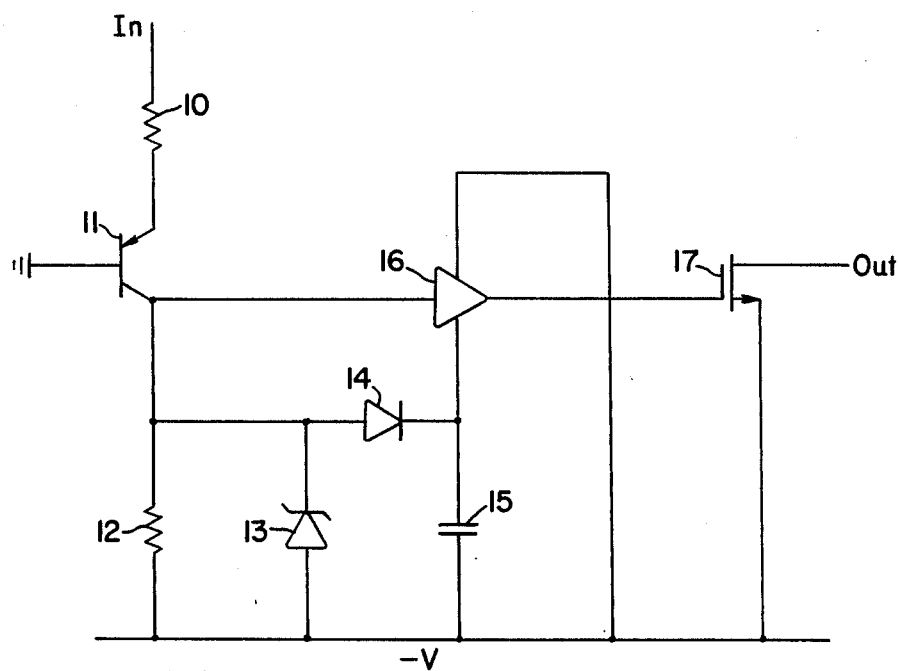
FIG. 1 is the basic structure of the driver coupled to a power MOSFET.

FIG. 1 is the basic structure of the driver coupled to n-channel power MOSFET. Generally, the driver is converting input signal, which can vary in a wide range, into binary output signal. The driver comprises a current source, resistor, capacitor, rectifier and buffer. The source provides a current in response to the input signal applied to input In and consists of the resistor 10 and pnp transistor 11. The base and emitter thereof are coupled to ground and the input via the resistor 10 respectively. The collector of the transistor 11 provides a current controlled by the input signal, and is coupled to the negative voltage source $-V$ via the resistor 12. Thereby, the voltage thereacross is responsive to the input signal. The resistor 10 is superfluous if maximum current of the input source is suitable.

The buffer 16 has an input coupled to the resistor 12 for sensing the voltage thereacross and accordingly providing the binary output signal. The buffer 16 is referenced to the source $-V$ and is supplied with the energy stored in the capacitor 15 which therefore provides the supply voltage. The rectifier consists of the single diode 14 coupled between the capacitor 15 and resistor 12 for limiting the voltage thereacross. Specifically, a portion of the collector current of the transistor 11 is applied to the capacitor 15 via the diode 14 when a voltage drop across the resistor 12 is substantially higher than the supply voltage. As a result, the capacitor 15 is charged and the supply voltage stored therein is increased.

The maximum voltage across the resistor 12 is limited by the zener diode 13 coupled thereacross. Consequently, the supply voltage is also limited thru the diodes 13 and 14. However, the zener diode 13 is superfluous if maximum collector current of the transistor 11 is suitable. The output of the buffer 16 is coupled to input of an external device such as the gate of the n-channel MOSFET 17. The source and drain thereof are coupled to the source $-V$ and output Out respectively. A load can be coupled between the output and ground.

If the signal applied to the input In goes high, a collector current results in a voltage drop across the resistor 12 so that the output voltage of the buffer 16 becomes high. However, the buffer 16 must charge the input capacitance of the MOSFET 17. The output current of the buffer 16 may be large and is supplied by the capacitor 15. As a result, the supply voltage thereacross is reduced. After the charging period and while the input voltage is still high, a portion of the collector current is charging the capacitor 15. Specifically, the diode 14 applies essentially the voltage appearing across the resistor 12 to the capacitor 15 if this voltage is higher than the supply voltage. The maximum supply voltage is limited by the zener diode 13. The capacitor 15 can be charged to the maximum supply voltage within a period of time which depends on the present supply voltage, maximum collector current and the value of the resistor 12.

The energy is delivered to the capacitor 15 only by means of the collector current of the transistor 11. The average energy provided thereby must be higher than the energy used to charge the input capacitance of the MOSFET 17. Thus, the maximum collector current can be relatively small and depends on the period of time during which the input signal is high, as pointed hereinabove. A constant rather than an occasional switching is obvious in systems requiring a very fast switching, accomplished in the present embodiment. The resistor 12 can have a high value and acts as pull-down resistor to ensure that the voltage thereacross is low when the input signal is low. The buffer 16 discharges the input capacitance of the MOSFET 17 merely by shorting out the gate and source thereof. The energy loss of capacitor 15 is then negligible.

Figure 2:
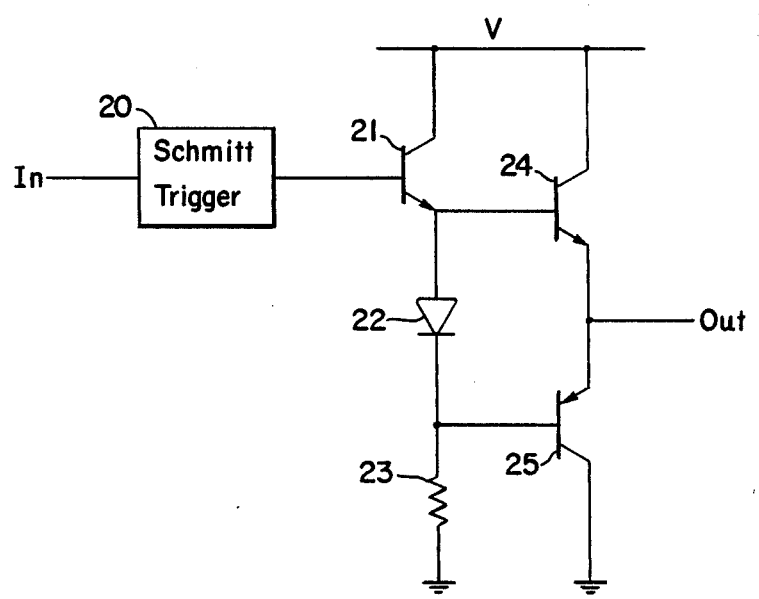
FIG. 2 is an embodiment of a buffer with optional Schmitt trigger input and push-pull output stage.

FIG. 2 is an embodiment of a buffer with optional Schmitt trigger input and push-pull output stage. The Schmitt trigger 20 is coupled in series with the input In for preventing undesired switching in response to an input signal having noise superimposed thereon. The Schmitt trigger 20 also makes a binary signal from slowly varying input signal.

The input current of the output stage is minimized by the npn transistor 21 having base, collector and emitter coupled to the input, voltage source V and base of the npn transistor 24 respectively. The transistors 24 and 25 are of opposite conductivity types and have collectors coupled to the supply voltage and ground respectively, and emitters coupled together for providing the binary output signal. The base of the transistor 25 is coupled to the base of the transistor 24 via the diode 22 and to ground via the resistor 23. The switching speed of the buffer is increased by the optional diode 22 whose forward voltage is approximately equal to the base-emitter voltage of the transistor 24 or 25. All transistors operate as voltage followers.

The output stage has no quiescent current and draws no current from the voltage source V when the output is low. There are also no cross-conduction current spikes. The present buffer can be employed as buffer 16 of FIG. 1, wherein the capacitor 15 will operate as the source V to apply the supply voltage between the collectors of the transistors 24 and 25.

Figure 3:
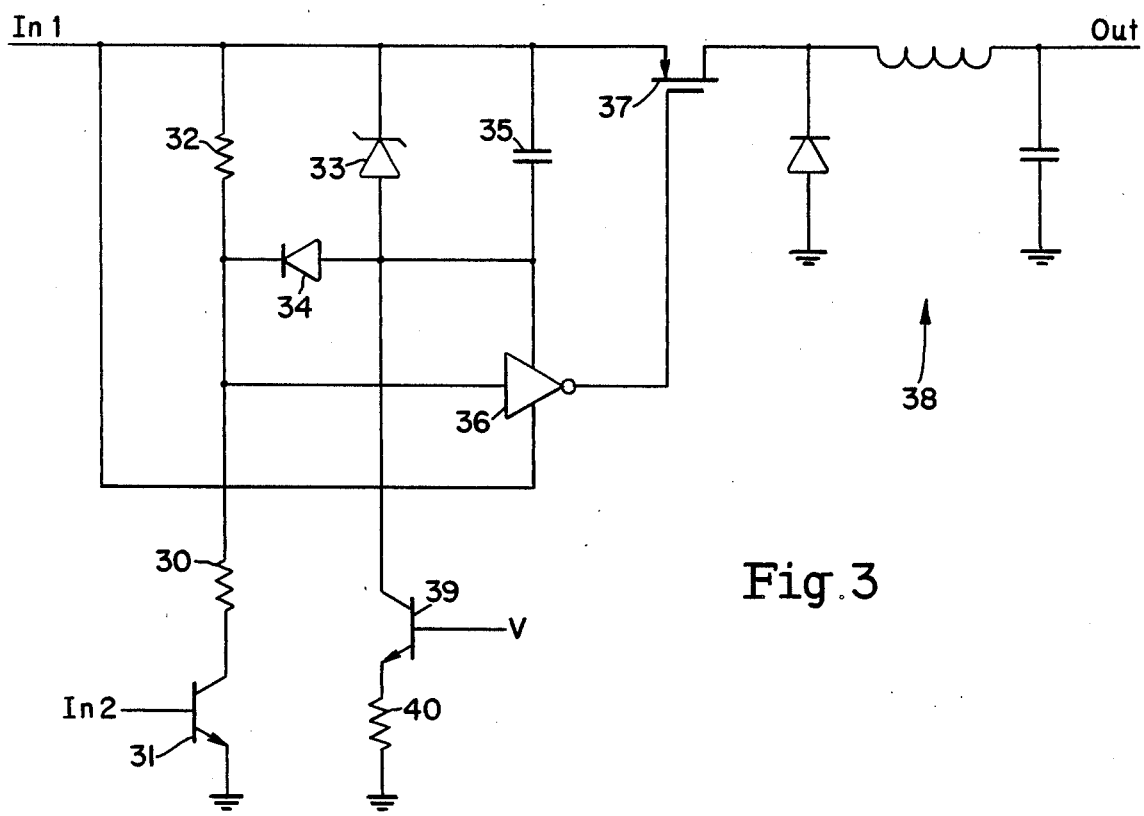
FIG. 3 is an embodiment of buck converter employing the driver.

FIG. 3 is an embodiment of buck converter employing the driver. The circuit comprises the components 32 thru 37 corresponding respectively to 12 thru 17 of FIG. 1. The controllable source provides a current in response to the input signal applied to input In2 and consists of the resistor 30 and npn transistor 31. The base and emitter thereof are coupled to In2 and ground respectively. The collector of the transistor 31 provides a current controlled by the input signal. The resistor 32 is coupled between the resistor 30 and input In1. The voltage across the resistor 32 is responsive to the input signal and also depends on the voltage applied to In1 which voltage may vary in a wide range.

The inverting buffer 36 has an input coupled to the resistor 32 for sensing the voltage thereacross and accordingly providing the binary output signal. The buffer 36 is referenced to In1 and is supplied with the energy stored in the capacitor 35 which therefore provides the supply voltage. The diode 34 is coupled between the capacitor 35 and resistor 32 for limiting the voltage thereacross. Specifically, a portion of the collector current of the transistor 31 is applied to the capacitor 35 via the diode 34 when a voltage drop across the resistor 32 is substantially higher than the supply voltage. As a result, the capacitor 35 is charged and the supply voltage stored therein is increased.

The supply voltage is limited by the zener diode 33 coupled across the capacitor 35. Consequently, the voltage across the resistor 32 is also limited thru the diodes 33 and 34. However, the zener diode 33 is superfluous if maximum collector current of the transistor 31 is suitable. The output of the buffer 36 is coupled to input of an external device which is the gate of the p-channel MOSFET 37. The source and drain thereof are coupled to In1 and components 38 respectively, whereby the buck converter topology is established. Specifically, the drain is coupled to ground via a diode and to output Out via an inductor. The diode is reversely polarized when the MOSFET 37 is on and conducts only the inductor current. The output of the buck converter is coupled to ground via a capacitor for obtaining a DC output voltage.

A low input signal applied to In2 cuts off the transistor 31, the voltage drop across the resistor 32 is zero and output voltage of the inverting buffer 36 becomes high with reference to In1. The input capacitance of the MOSFET 37 is charged by the buffer 36, wherein the output current thereof is supplied by the capacitor 35. As a result, the supply voltage thereacross is reduced. A high input signal applied to In2 results in a collector current of the transistor 31 and a voltage drop across the resistor 32 so that the output voltage of the inverting buffer 36 becomes low with reference to In1. The buffer 36 discharges the input capacitance of the MOSFET 37 merely by shorting out the gate and source thereof. The energy loss of the capacitor 35 is then negligible.

While the input voltage is still high, a portion of the collector current is charging the capacitor 35. Specifically, the diode 34 essentially applies the voltage appearing across the resistor 32 to the capacitor 35 if this voltage is higher than the supply voltage. The average energy delivered to the capacitor 35 by means of the collector current of the transistor 31 may be insufficient, i.e. smaller than the energy necessary to charge the input capacitance of the MOSFET 37.

An additional energy is provided to the capacitor 35 by the optional constant current source consisting of the resistor 40 and npn transistor 39. The base, collector and emitter thereof are coupled respectively to the voltage source V, capacitor 35 and ground via the resistor 40. The voltage source V may be responsive to the input signal applied to In2 and, when the signal is high, cut off the transistor 39. By these means the power dissipation thereof is reduced while the transistor 31 or 39 one at a time delivers the energy to the capacitor 35.

Coupling the resistor 30 in series with the emitter rather than collector of the transistor 31, similarly to 40 and 39, results is a higher performance as the voltage applied to In1 may vary in a wider range. However, the present embodiment points out that the transistor 31 may be a part of a separate integrated circuit, e.g. an inverter with open collector output. Moreover, variations of the In1 voltage may be insignificant when the buffer 36 includes the Schmitt trigger. Such buffers usually has inverting output and are readily available in integrated form. The buffer shown in FIG. 2 can be employed.

The transistor 39 may deliver the entire energy necessary for the operation of the driver. The diode 34 is then superfluous or is employed to limit the voltage across the resistor 32. Limiting by means of a zener diode would reduce switching speed due to a large parasitic capacitance thereof. Moreover, the current source comprising the transistor 31 and resistor 30 operates as isolating means. Generally, the means has an input and output for receiving the input signal and providing a signal in response thereto respectively, wherein an impedance between the input and output is substantially high. The current source with the transistor 31 has a large output impedance when the input signal applied to In2 is low. Otherwise, the output impedance is approximately equal to the value of the resistor 30 and is considered high up to a predetermined voltage applied to In1.

The isolating means can also employ an optocoupler having input coupled to In2 and an open collector output coupled in place of the diode 34. An internal output buffer of the optocoupler can be supplied from the capacitor 35 and further include the resistor 32 and buffer 36. Similarly, an isolating transformer can be employed. The primary and secondary windings thereof can be coupled to input In2 and in place of the resistor 32 respectively. Size and cost of the transformer can be significantly reduced as energy transformed thereby is minimal.

Figure 4:
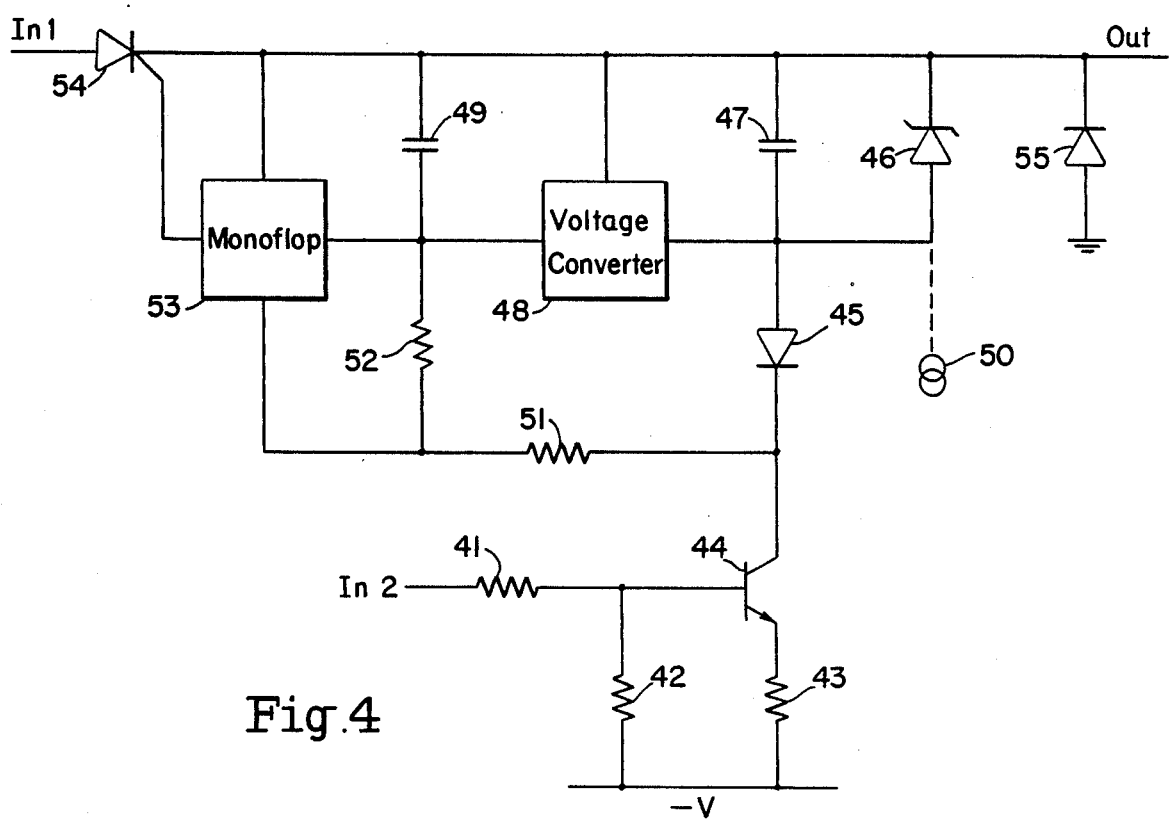
FIG. 4 is an embodiment of a thyristor driver with a voltage converter.

FIG. 4 is an embodiment of a thyristor driver with a voltage converter. The apparatus rectifies an AC input signal applied to input In1 and handles variable loads. An average power and/or voltage applied thereto depends on gate pulse delay to the thyristor 54 and thereby the conduction angle thereof. The controllable source provides a current in response to the input signal applied to input In2 and consists of the resistors 41 thru 43 and npn transistor 44. The base and emitter thereof are coupled to the negative voltage source −V via the resistors 42 and 43 respectively. The base is also coupled to In2 via the resistor 41. The collector of the transistor 44 provides a current controlled by the input signal and is coupled to the cathode of the diode 45 for charging the capacitor 47. The voltage thereacross is limited by the zener diode 46. The optional diode 55 is coupled between the output Out and ground to ensure proper charging of the capacitor 47 even with no user's load.

The voltage across the capacitor 47 is inverted by means of the voltage converter 48 and stored in the capacitor 49. Voltage converters such as 48 are readily available in integrated form. They usually contain an oscillator, two pairs of switches responsive thereto and an internal capacitor. This capacitor is alternatively coupled to the converter input and output so that a voltage of opposite polarity appears thereat. Therefore, the voltage across the capacitors 47 and 49 is respectively negative and positive with reference to Out.

The monoflop 53 is referenced to Out and receives the positive supply voltage from the capacitor 49. The input of the monoflop 53 is coupled to the capacitor 49 via the pull-up resistor 52 and to the collector of the transistor 44 via the resistor 51. Thereby, the voltage at the monoflop input is positive and responsive to the input signal applied to In2. The resistor 51 may be substituted for a zener diode so that the monoflop input receives a higher input pulse. The monoflop 53 may be triggered on a positive or negative edge of the pulse and further have a Schmitt trigger input. The anode, cathode and gate of the thyristor 54 are coupled to In1, Out and output of the monoflop 53 respectively.

The monoflop 53 provides a pulse of binary output signal, which is a positive voltage pulse with reference to the cathode of the thyristor 54. The buffer shown in FIG. 2 can be employed to drive the gate of the thyristor 54 via a resistor. The energy for the pulse is stored in the capacitor 49. The length and magnitude of the pulse is sufficient to trigger the thyristor 54. When the pulse is ceased, the energy loss of the capacitors 47 and 49 is negligible.

The energy is delivered to the capacitor 47 only by means of the collector current of the transistor 44. The average energy provided thereby must be higher than the energy of the pulse delivered to the gate of the thyristor 54. Thus, the maximum collector current can be relatively small. Moreover, the collector current may be always greater than zero and only slightly alter in response to the In2 signal, as determined by the resistors 41 and 42. Thereby, the energy may be constantly delivered to the capacitor 47. Voltage variations thereacross may have a small effect on the voltage across the capacitor 49. For instance, this voltage will be stable if the voltage converter 48 includes an output voltage regulator. The resistors 51 and 52 are coupled in series so that the voltage thereacross is also limited. Specifically, on one end the voltage is limited by the capacitor 49 and on the other end by the diode 45 coupled to the capacitor 47. The optional current source 50 provides an additional current to the capacitor 47.

The current source 50 may deliver the entire energy necessary for the operation of the driver. The resistor 51 is then superfluous and the collector of the transistor 44 can be coupled directly to the pull-up resistor 52 and thus input of the monoflop 53. The diode 45 is also superfluous or is employed to limit the voltage across the resistor 52. Moreover, the current source comprising the transistor 44 and resistors 41 thru 43 operates as isolating means, and has a large output impedance. The isolating means can also employ an optocoupler having input coupled to In2 and an open collector output coupled between the input of the monoflop 53 and output Out. Similarly, an isolating transformer can be employed. The primary and secondary windings thereof can be coupled to input In2 and in place of the resistor 52 respectively. Size and cost of the transformer can be significantly reduced as energy transformed thereby is minimal.

Generally, the voltage converter 48 and capacitors 47, 49 constitute a capacitive means for storing the supply voltage. The capacitor 47 receives the portion of the collector current of the transistor 44 via the diode 45 and/or current of the current source 50, and stores a first voltage. The voltage converter 48 converts the first voltage into a second voltage of an opposite polarity which voltage is stored in the capacitor 49. In particular, the voltages across the capacitors 47 and 49 are respectively negative and positive with reference to Out. The monoflop 53 can be supplied from the capacitors 47 and 49 to provide a bipolar output signal. This can be used to control a triac.

Figure 5:
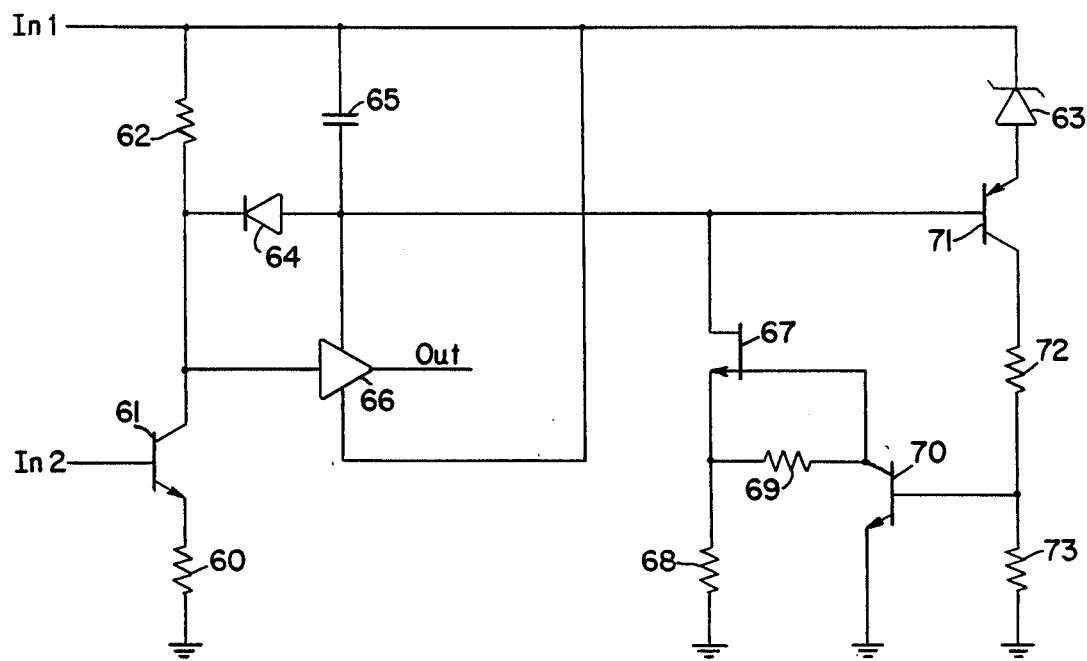
FIG. 5 is the preferred embodiment of the driver with variable charging current.

FIG. 5 is the preferred embodiment of the driver with variable charging current. The circuit comprises the components 60 thru 66 corresponding respectively to 10 thru 16 of FIG. 1. The input signal is applied to input In2 and base of the npn transistor 61. The emitter and collector thereof are coupled to ground via the resistor 60 and In1 via the resistor 62 respectively. The collector of the transistor 61 provides a current controlled by the input signal. The buffer 66 is sensing the voltage across the resistor 62 and accordingly provides the binary output signal. The buffer 66 is referenced to In1 and is supplied with the energy stored in the capacitor 65 which therefore provides the supply voltage. The optional diode 64 is coupled between the capacitor 65 and resistor 62 for limiting the voltage thereacross. The output of the buffer 16 is coupled to the output Out, whereby an external device can be coupled between the In1 and Out.

The capacitor 65 is charged essentially by an adjustable current source comprising the n-channel JFET 67 with the drain coupled to the capacitor 65. The charging current is determined by a means for limiting the supply voltage stored in the capacitor 65. The means includes the pnp transistor 71 having base coupled to the capacitor 65 and emitter coupled to In1 via the zener diode 63. Therefore, the maximum supply voltage is equal to the sum of the respective base-emitter voltage and zener voltage. The resistor 73 is coupled to ground and to the collector of the transistor 71 via the resistor 72. The voltage drop across the resistor 73 depends on the collector current of the transistor 71 and is sensed by the npn transistor 70. Specifically, the base and emitter thereof are coupled across the resistor 73.

The transistor 67 provides maximum charging current when the transistor 70 is cut off, whereby the gate and source of the transistor 67 are tied together via resistor 69. Similarly, the charging current is minimal when the transistor 70 is saturated, whereby the gate and source of the transistor 67 are effectively coupled to ground via the transistor 70 and resistor 68 respectively. By these means, the charging current depends on the present supply voltage. In particular, the charging current is reduced to a minimum when the supply voltage has reached the maximum value, whereby the power dissipation of the transistor 67 is minimized. The maximum drain current thereof is significantly greater than maximum collector currents of the transistors 61 and 71.

The current source comprising the transistor 61, resistors 60 and 62 operates as the isolating means, wherein the impedance between In1 and In2 is large. Similarly to the previous embodiments the isolating means can also employ an optocoupler or transformer for providing a signal between In1 and input of the buffer 66 in response to the signal applied between In2 and ground. The capacitor 65 represents the capacitive means which can further provide supply voltages of opposite or both polarities to the buffer 66. The buffer 66 may include a Schmitt trigger, monoflop and push-pull output stage.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Driver for converting input signal into binary output signal, comprising:
   a current source means for providing a current in response to the input signal;
   a resistive means for obtaining a voltage in response to the current;
   a capacitive means for storing a supply voltage;

a rectifying means coupled between the capacitive means and resistive means for limiting the voltage thereof; and a buffer means for receiving the supply voltage and providing the binary output signal in response to the resistive means voltage.

2. Driver of claim 1 wherein the resistive means includes a means for limiting the voltage thereof.

3. Driver of claim 1 wherein the capacitive means includes a means for limiting the supply voltage.

4. Driver of claim 3 wherein the first said current source means includes a second current source means for providing a second current to the capacitive means.

5. Driver of claim 4 wherein the second current source means includes a means for limiting the second current in response to the means for limiting the supply voltage.

6. Driver of claim 1 wherein the capacitive means includes:

an input capacitive means coupled to the rectifying means for storing a first voltage;

a means for converting the first voltage into a second voltage of an opposite polarity; and an output capacitive means for storing the second voltage.

7. Driver of claim 1 wherein the buffer means includes a Schmitt trigger.

8. Driver of claim 1 wherein the buffer means includes a monoflop means for providing a pulse of the binary output signal.

9. Driver of claim 1 wherein the buffer means includes a push-pull output stage.

10. Driver of claim 9 wherein the buffer means includes a pair of transistors of opposite conductivity types having collectors with the supply voltage applied therebetween, and emitters coupled together for providing the binary output signal.

11. Driver for converting input signal into binary output signal, comprising:

an isolating means having an input and output for receiving the input signal and providing a signal in response thereto respectively, wherein an impedance between the input and output is substantially high;

a current source means for providing a current;

a capacitive means for receiving the current and storing a supply voltage, and including a means for limiting the supply voltage; and a buffer means for receiving the supply voltage and providing the binary output signal in response to the isolating means signal.

12. Driver of claim 11 wherein the isolating means includes:

a second current source means coupled to the input for providing a second current in response to the input signal; and a resistive means coupled to the output for obtaining a voltage in response to the second current.

13. Driver of claim 12 further including a rectifying means coupled between the capacitive means and resistive means for limiting the voltage thereof.

14. Driver of claim 11 wherein the current source means includes a means for limiting the current in response to the means for limiting the supply voltage.

15. Driver of claim 11 wherein the capacitive means includes:

an input capacitive means for receiving the current and storing a first voltage;

a means for converting the first voltage into a second voltage of an opposite polarity; and an output capacitive means for storing the second voltage.

16. Driver of claim 11 wherein the buffer means includes a Schmitt trigger.

17. Driver of claim 11 wherein the buffer means includes a monoflop means for providing a pulse of the binary output signal.

18. Driver of claim 11 wherein the buffer means includes a push-pull output stage.

19. Driver of claim 18 wherein the buffer means includes a pair of transistors of opposite conductivity types having collectors with the supply voltage applied therebetween, and emitters coupled together for providing the binary output signal.

* * * * *